United States Patent [19]

Mehra et al.

[11] Patent Number: 4,992,152
[45] Date of Patent: Feb. 12, 1991

[54] REDUCING HILLOCKING IN ALUMINUM LAYERS FORMED ON SUBSTRATES

[75] Inventors: Madhav Mehra, Rochester; Tonya D. Binga, Hilton, both of N.Y.

[73] Assignee: Eastman Kodak Company, Rochester, N.Y.

[21] Appl. No.: 504,362

[22] Filed: Apr. 4, 1990

Related U.S. Application Data

[63] Continuation-in-part of Ser. No. 341,266, Apr. 20, 1989, abandoned.

[51] Int. Cl.$^5$ .................. C23C 14/34; H01L 21/44
[52] U.S. Cl. ................. 204/192.15; 437/194; 437/200; 204/192.17
[58] Field of Search ............. 437/194, 195, 196, 197, 437/200, 203; 204/192.15, 192.17

[56] References Cited

U.S. PATENT DOCUMENTS

| | | | |
|---|---|---|---|
| 3,986,897 | 10/1976 | McMillan et al. | 148/6.27 |
| 4,012,756 | 3/1977 | Chaudhari et al. | 357/5 |
| 4,322,453 | 3/1982 | Miller | 437/200 X |
| 4,384,301 | 5/1983 | Tasch, Jr. et al. | 437/200 X |

FOREIGN PATENT DOCUMENTS

| | | | |
|---|---|---|---|
| 0037856 | 3/1982 | Japan | 437/200 |
| 0231836 | 12/1984 | Japan | 437/200 |
| 0009169 | 1/1985 | Japan | 437/200 |
| 0015330 | 1/1986 | Japan | 437/194 |
| 0208241 | 9/1986 | Japan | 437/194 |

OTHER PUBLICATIONS

B. Draper et al., "A Hillock-Free ... Interconnects", 1985, Procs. Second Int'l IEEE VLSI Multilevel Interconnection Conf., Santa Clara, Calif., 6/85, pp. 90–101.

*Primary Examiner*—Nam X. Nguyen
*Attorney, Agent, or Firm*—Raymond L. Owens

[57] ABSTRACT

A method of reducing hillocks in an aluminum layer sputtered onto a substrate includes depositing a layer of $WSi_2$ on the aluminum layer having a thickness of between 1500–2500 Å and then sintering these bilayers.

1 Claim, 2 Drawing Sheets

REDUCING HILLOCKING IN ALUMINUM LAYERS FORMED ON SUBSTRATES

CROSS REFERENCE TO RELATED APPLICATIONS

This is a continuation in part of our earlier filed application Ser. No. 341,266, filed on Apr. 20, 1989 abandoned.

FIELD OF THE INVENTION

This invention relates to a method for reducing the formation of hillocks in aluminum layers sputtered onto substrates.

BACKGROUND OF THE INVENTION

In a well known process, a thin aluminum layer is deposited by sputtering onto a substrate. Atoms of aluminum from a target are ejected from the target by impact from an ionized gas. The aluminum atoms are then deposited on the surface of the substrate.

When a thin metal layer, particularly soft metal such as aluminum with a high coefficient of thermal expansion is sputtered onto a substrate with a low coefficient of thermal expansion, such as silicon or silicon dioxide, microscopic protrusions often appear in the surface of the metal layer. Such protrusions commonly appear in the aluminum metallization layers deposited on oxidized silicon surfaces in the manufacture of integrated circuits. Protrusions appearing immediately after deposition of the aluminum layer are termed "growth hillocks". The protrusions which develop after cycling the integrated circuit to a high temperature during manufacturing steps are called "annealing hillocks".

In either case, these microscopic protrusions or hillocks are troublesome and can cause subsequent device failure. For example, hillocks can cause shorts between conductive layers in a device in areas where conductors cross over one another, or in elements of the device having two layers of conductors such as integrated capacitors. More particularly, if an insulating layer, e.g. $SiO_2$ is formed on an aluminum layer at a thickness of less than $1\mu$ metal hillocks greater than $1\mu$ will protrude through the $SiO_2$ layer and contact any subsequently deposited metal layers, causing a short circuit. The protrusion of the hillocks potentially causes short circuits between conductive layers in a device at positions where the conductors cross over each other, or in devices where there are two spaced apart layers such as in capacitors, forming part of an integrated circuit. Hillocks are also found in aluminum layers formed in optical disks.

Previous attempts to overcome the problem of hillock formation in thin aluminum layers have included the addition of impurities such as silicon, copper, silver and gold to the aluminum to immobilize the grain boundaries in the metal layer (see e.g. U.S. Pat. No. 4,012,756 issued Mar. 15, 1977 to Chaudhari et al). One suggested approach to reducing hillocks specifically in aluminum layers is to treat the layer to form a boehmite (AlO-OH) layer on its surface; see e.g. U.S. Pat. No. 3,986,897 issued Oct. 19, 1976 to McMillan et al.

Yet another disclosed approach to reducing hillocks in aluminum layers is to alternate layers of aluminum and an aluminum oxygen alloy, by periodically introducing controlled bursts of oxygen into an aluminum deposition chamber. None of these approaches has proved entirely satisfactory however.

Draper et al in an article entitled "A Hillock-Free Conductor System for Use in Multilevel Interconnects," 2nd Int'll IEEE VLSI Multilevel Interconnection Conf., Santa Clara, Calif., June 1985, pp. 90–101, discusses the use of tantalum silicide on aluminum to reduce hillocks. In multilevel devices $SiO_2$ is frequently deposited on the metal layer and then in particular locations etched down to the surface of the metal by HF acid. Unfortunately, HF also attacks tantalum silicide and at an etch rate of 300–600 Å/min.

The object of this invention is to provide a simple, effective means of reducing hillock formation in aluminum layers sputtered onto a substrate eliminating the problems discussed above.

SUMMARY OF THE INVENTION

This object is achieved in a method in which aluminum is sputtered from a target onto the surface of a substrate to deposit a layer of aluminum metal. A layer of $WSi_2$ is deposited on the aluminum layer in the same vacuum and both layers are then sintered, so when sintered these layers react and reduce hillock formation.

These composite layers form effective electrical connections that have a reduced tendency to short circuit due to hillock formation.

A feature of this invention is that $WSi_2$ in not subject to attack by HF.

DESCRIPTION OF THE PREFERRED EMBODIMENT

As used herein, the term "substrate" means the underlying material such as for example silicon, silicon dioxide or silicon nitride on which an aluminum layer is deposited. The term "substrate" does not, however, mean only the base material forming the wafer on which a device such as an integrated circuit is fabricated. The substrate on which the aluminum layer is applied may also include appropriate dopants to provide n or p type dopings depending upon the device being fabricated. It is preferable that the deposited aluminum layer has a significantly higher coefficient of thermal expansion than the selected substrate.

Ordinarily aluminum targets are doped with 1% silicon and sometimes from 1 to 4% copper. These impurities help to prevent cracks from forming at the interface between the deposited aluminum layer and the substrate.

Figure 1:
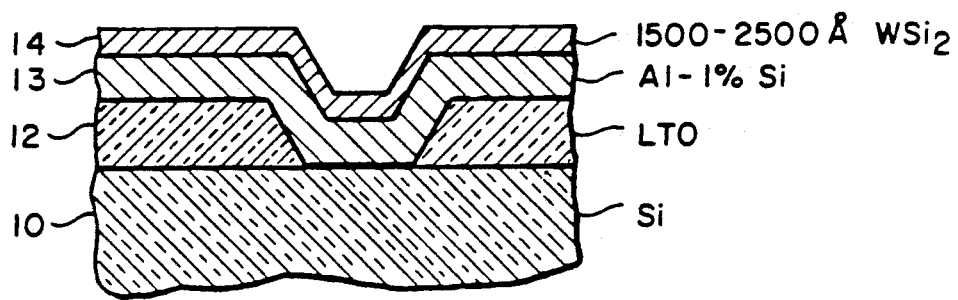
FIG. 1 shows the final structure produced by the process of this invention.

Turning now to FIG. 1, a Si substrate is indicated as layer 10. On it is deposited and patterned a dielectric layer 12 such as low temperature oxide (LTO). The purpose of layer 12 is to isolate the metal layers from the underlying substrate in all regions except where contact is desired. Openings are formed in layer 12 exposing the Si substrate by means of lithography and etching.

A primary metallization layer 13, formed of Al or some alloy thereof (preferably such as Al-1% Si), is then sputtered onto layer 12 and into the openings so it makes contact with the substrate 10. Immediately thereafter a layer 14 of $WSi_2$, which has a thickness between 1500-2500Å, is sputtered onto layer 13. Layer 13 may be in a range in thickness between 6000 and 9000Å.

It is important that layer 14 be sputtered directly on layer 13 without breaking the vacuum in the sputter chamber, as this does not permit the formation of a native oxide on the Al layer.

Subsequent sintering of this structure permits reaction between the $WSi_2$ layer 13 and all of layer 14 that eliminates hillock formation. The length of sintering that is adequate ranges from 30 minutes at 450° C. to 120 minutes at 450° C. in a forming gas ambient. A number of different devices have been made using this process. In such devices, hillock formation has been substantially reduced. The former conditions are typical of those used in post metallization anneals, while the latter condition includes adequate thermal budget to simulate any intermediate dielectric depositions that may be required.

Figure 3:
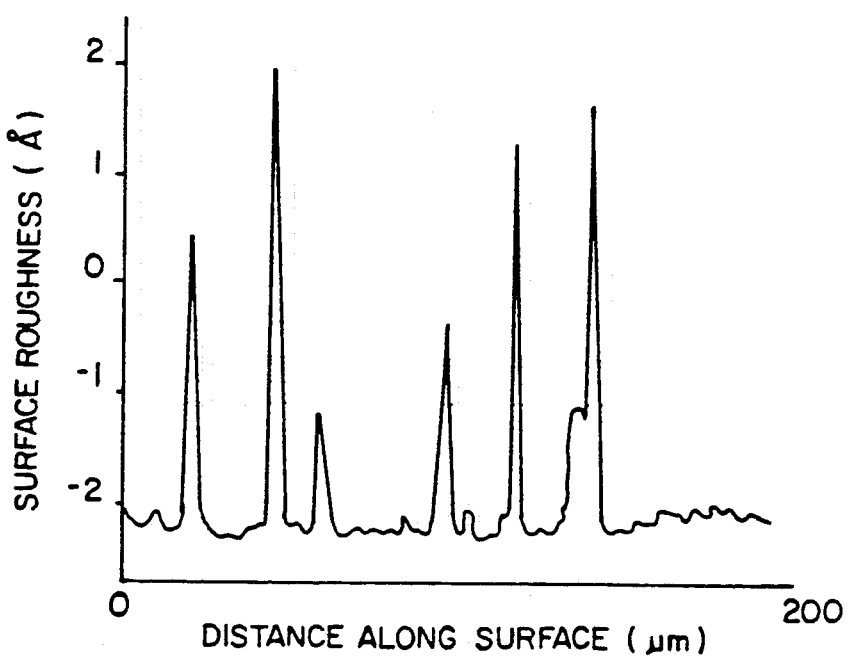
FIG. 3 is a graph of the surface roughness of 8000Å layer of aluminum coated on a substrate; after three sinters. Each sinter is at 450° C. for 30 minutes.

Turning to FIG. 3 we see a graph of the surface roughness of a layer of 8000Å aluminum coated on a Si substrate. This structure was sintered three times. For each sinter, the wafers were heater to 450° C. in a forming gas ambient and kept there for 30 minutes. The wafers were cooled to room temperature between sinters. The horizontal axis is labeled "Distance along the surface ($\mu$m)." It represents the distance over which a stylus was dragged along the surface. The axis is measured in microns. The vertical axis is the vertical dimension of the surface roughness. The maximum range shown in the figure is 5000Å. This graph shows that the surface is quite rough and can produce hillocks as large as 4000Å.

Figure 2:
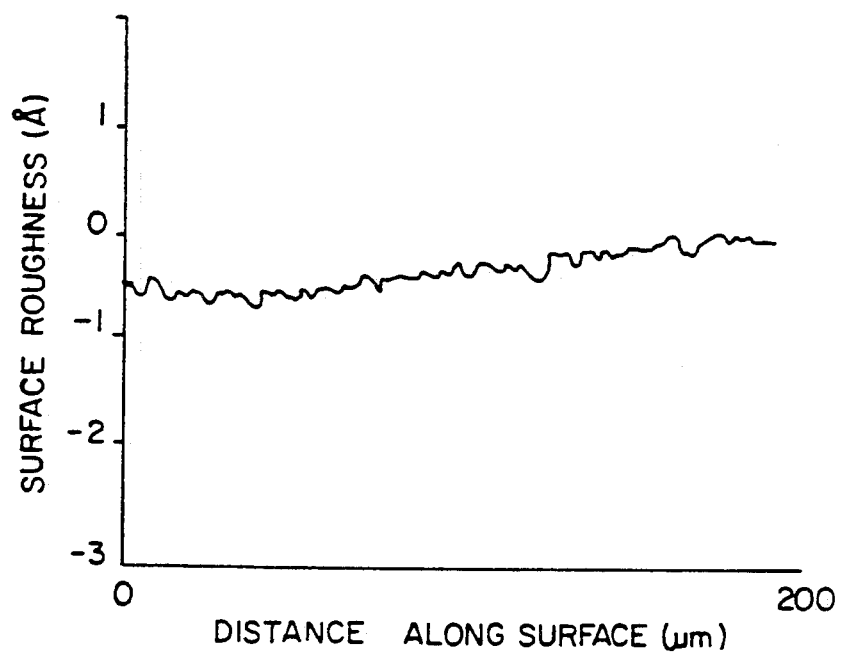
FIG. 2 is a graph of the surface roughness of an 8000Å layer of aluminum coated on a substrate and a 2000Å layer of $WSi_2$ coated on the aluminum layer in the same vacuum after three sinters.

In FIG. 2 a 2000Å layer of $WSi_2$ coated on an 8000Å layer of aluminum was sintered three times. The same vertical and horizontal axes as FIG. 2 were used. The resulting surface was quite smooth.

A feature of $WSi_2$ is that it is not subject to attack by HF.

The invention has been described in detail with particular reference to preferred embodiments thereof, but it will be understood that variations and modifications can be effected within the spirit and scope of the invention.

We claim:

1. A method of reducing hillocks occurring in the layer of aluminum sputtered onto a substrate consisting essentially of the steps of:
   (a) sputtering aluminum from a target onto the surface of a substrate to deposit a single layer of aluminum on such substrate having a thickness of between 6000-9000Å;
   (b) depositing a single layer of $WSi_2$ on top of the aluminum layer having a thickness of between 1500-2500Å; and
   (c) sintering the deposited aluminum and $WSi_2$ layers.

* * * * *